United States Patent
Chiu et al.

(10) Patent No.: US 8,227,832 B2
(45) Date of Patent: Jul. 24, 2012

(54) SIGE HETEROJUNCTION BIPOLAR TRANSISTOR MULTI-FINGER STRUCTURE

(75) Inventors: Tzuyin Chiu, Shanghai (CN); Zhengliang Zhou, Shanghai (CN); Xiongbin Chen, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 87 days.

(21) Appl. No.: 12/971,063

(22) Filed: Dec. 17, 2010

(65) Prior Publication Data

US 2011/0147793 A1 Jun. 23, 2011

(30) Foreign Application Priority Data

Dec. 21, 2009 (CN) .......................... 2009 1 0202009

(51) Int. Cl.
*H01L 29/66* (2006.01)

(52) U.S. Cl. .................. 257/156; 257/E29.191; 257/47; 257/197; 257/183; 257/471; 257/511; 257/517; 257/E31.069; 257/565

(58) Field of Classification Search .................. 257/156, 257/E29.191, 47, 197, 183, 474, 511, 517, 257/E31.069, 565

See application file for complete search history.

*Primary Examiner* — Bradley K Smith
*Assistant Examiner* — Mohammad T Karimy
(74) *Attorney, Agent, or Firm* — Rabin & Berdo, P.C.

(57) ABSTRACT

The present invention provides a multi-finger structure of a SiGe heterojunction bipolar transistor (HBT). It is consisted of plural SiGe HBT single cells. The multi-finger structure is in a form of C/BEBC/BEBC/.../C, wherein, C, B, E respectively stands for collector, base and emitter; CBEBC stands for a SiGe HBT single cell. The collector region is consisted of an n type ion implanted layer inside the active region. The bottom of the implanted layer is connected to two n type pseudo buried layers. The two pseudo buried layers are formed through implantation to the bottom of the shallow trenches that surround the collector active region. Two collectors are picked up by deep trench contact through the field oxide above the two pseudo buried layers. The present invention can reduce junction capacitance, decrease collector electrode output resistance, and improve device frequency characteristics.

15 Claims, 2 Drawing Sheets

C  B E B C B E B C B E B  C

SIGE HETEROJUNCTION BIPOLAR TRANSISTOR MULTI-FINGER STRUCTURE

BACKGROUND OF THE INVENTION

1. Field of the Invention

The present invention generally relates to a semiconductor device structure and the manufacturing process thereof, more particularly to the design and fabrication of a high driving current multi finger bipolar transistor device.

2. Description of Related Art

In radio frequency (RF) application, higher device cut off frequency ($f_T$) is needed. Although higher $f_T$ can be achieved by advanced RFCMOS technology, it is still unable to fully satisfy RF application requirement. For example, it is difficult to get $f_T$ above 40 GHz. It is also very costly to develop advanced CMOS technology to get higher $f_T$. The devices with compound semiconductor material can get very high $f_T$, but the usage is restricted due to higher material cost, lower wafer size and poisonous nature of most of compound semiconductor material.

SiGe HBT is a good choice of high $f_T$ devices. Firstly, the emitter injection efficiency and current gain can be increased due to band gap difference of SiGe base to silicon emitter. Secondly, base resistance can be reduced and $f_T$ can be increased by heavily doped SiGe base. Lastly, SiGe module is compatible with silicon process. Now SiGe HBT is widely used in high $f_T$ device application.

As illustrated in FIG. 1, a multi-finger structure is used in existing SiGe HBT to increase current driving capability. To realize such a multi-finger structure, arrange the emitter (E) or the base (B) at the center, and symmetrically arrange bases or emitters at both sides of the central emitter or base, in a formation as C/BE/BE...BE/B/C, wherein, a base (B) is used by neighboring emitters, collectors (C) are formed at both ends of the structure, and the two collectors are connected to each other by a deep buried layer formed below the multi-finger structure, so that an overall multi-finger device structure is finally finished.

FIG. 2 illustrates a single device structure of an existing SiGe HBT multi-finger device, which includes collector 114, base 111, and emitter 110. The collector 114 is a medium doped or low doped n type epitaxial layer formed on top of the n type heavily doped buried layer 102. The collector 114 is connected to a metal electrode 107 through the n type heavily doped buried layer 102, the n type heavily doped collector pick up 104, and the contact 106, wherein, the n type heavily doped buried layer 102 is formed on top of the substrate 101; the n type heavily doped collector pick up 104 is in the active region; the contact 106 is formed through the interlayer dielectric 105. The n type heavily doped collector pick up 104 is formed by a high dose and high energy ion implantation. The area of the collector pick up 104 is large, so that the sidewall capacitance of the collector is also large. Both sides of the collector 114 are isolated by shallow trench oxide 103. Due to the large area of the buried layer, a deep trench 115 filled with polysilicon is added to the bottom of the shallow trench oxide 103 between devices to reduce the collector to substrate parasitic capacitance. The base 111 is a p type in situ doped SiGe epitaxial layer; the base 111 is connected to the electrode through a polysilicon layer 108 and a contact. A silicon oxide dielectric layer 113 is formed below the polysilicon layer 108. The emitter 110 is consisted of an n type heavily doped polysilicon layer formed on top of the base 111. Silicon oxide spacers 112 are formed at both sidewalls of the emitter 111. The contact area between the emitter 110 and the base 111 is determined by the window size of the silicon oxide dielectric layer 109. When opening the emitter window, selective ion implantation at the center of the collector which just enclose the emitter window can be performed to adjust breakdown voltage and cut off frequency of the SiGe HBT. To keep cut off frequency less affected, when multi-finger structure is adopted to increase the current driving capability, collectors should be arranged at the outmost sides of the whole device structure, as shown in FIG. 1.

This SiGe HBT multi-finger structure is reliable and widely used. But the main disadvantages are: a buried layer of large size is formed through the whole multi-finger device to connect the two collectors at the outmost sides, which leads to large junction capacitance, and impacts the device speed. In the meantime, due to a great number of emitters but only few collectors, the current is concentrated in the buried layer and in the collector electrode, the collector junction size needs to be increased to avoid too high current density, which further increases the junction capacitance. Thus a multi-finger device structure only adopts two collector electrodes at both ends instead of multiple collectors in order not to increase junction area and impact device speed.

SUMMARY OF THE INVENTION

The objective of the present invention is to provide a SiGe HBT multi-finger structure, which can reduce capacitance, decrease collector output resistance, and improve frequency characteristics.

To achieve the aforementioned objective, the SiGe HBT multi-finger structure of the present invention is consisted of a plurality of SiGe HBT single cells; the multi-finger structure can be expressed as C/BEBC/BEBC/.../C, wherein C, B and E respectively represents a collector, a base and an emitter of a SiGe HBT, and CBEBC represents a SiGe HBT single cell; two neighboring SiGe HBT single cells share a same collector. The active region of a SiGe HBT single cell is isolated by field oxide shallow trenches, wherein a SiGe HBT single cell comprises: a collector region, consisting of an n type ion impurity implanted layer formed in the active region, the bottom of the collector region being connected to a buried layer formed by two n type pseudo buried layers at both sides of the active region, the collector region being connected to two collectors through the two n type pseudo buried layers and two deep trench contacts formed in the field oxide above the n type pseudo buried layers; a base region, consisting of a p type SiGe epitaxial layer formed on top of the collector region, the base region being connected to two bases through two polysilicon layers at both sides of the base region and two metal contacts formed on the polysilicon layers; and an emitter region, consisting of an n type polysilicon layer formed on top of the base region, the emitter region being connected to an emitter through a metal contact formed on top of the emitter region.

The n type pseudo buried layers are formed by n type ion impurity implantation, wherein the n type ion impurity is phosphorus. The dosage of the n type ion impurity implantation is 1e14~1e16 cm$^{-2}$, and the energy is 2~50 KeV. During the implantation of the pseudo buried layers, the top of the active region is protected by a hard mask, and the sidewalls of the active region are protected by sidewall spacers to prevent ion impurity from implanting into the active region. The hard mask is consisted of three dielectric layers, which are from the bottom up a silicon oxide layer, a silicon nitride layer, and a silicon oxide layer. The thicknesses of the three dielectric layers from the bottom up are respectively in the ranges of 100 Å~300 Å, 200 Å~500 Å, and 300 Å~800 Å; the thicknesses are determined by the energy of the n type ion impurity implantation. The thickness of the sidewall spacers is in a range of 300 Å~1000 Å, also determined by the energy of the n type ion impurity implantation. When the width of the active region is less than 0.5 um, the two pseudo buried layers are interconnected inside the active region through lateral diffusion to form the buried layer; when the width of the active region is more than 0.5 um, the two pseudo buried layers are interconnected to form the buried layer by implanting the same type of ion impurity as of the pseudo buried layers into the active region at the same depth as of the pseudo buried layers.

The n type ion impurity of the collector region is phosphorus, and the dosage is 5e12~1e14 $cm^{-2}$. The collector region is formed by n type ion impurity implantation to the entire SiGe HBT region after removing of the top silicon oxide layer of the hard mask. The deep trench contact of the collector is formed by filling the deep trench with titanium and titanium nitride transitional metal and metal tungsten. Metal deposition can adopt PVD or CVD; the thicknesses of the titanium and the titanium nitride are respectively in a range of 100 Å~500 Å and 50 Å~500 Å. The depth of the deep trench is determined by the depth of the shallow trench plus the thickness of the inter-layer dielectric between the metal layer and the substrate. Ohmic contact of the collector is formed directly by the deep trench contact and the pseudo buried layer connected thereto, or formed by n type impurity self-aligned implantation to the bottom of the deep trench contact after the deep trench is etched.

When defining the base window, two materials of big difference in etch rate are adopted, in order to protect the interface between the collector region and the base region. The first layer is silicon oxide, the second layer is polysilicon or silicon nitride, the thickness of the first layer is 100 Å~500 Å, the thickness of the second layer is 200 Å~1000 Å. When opening the base window via lithography, the second thin film layer is etched first, and stops on the first thin film which is almost intact, and then n type collector region ion implantation is carried out with the photo resist on.

The benefits of the present invention are: the junction capacitance is much smaller than that of a conventional device as heavily doped ion implantation is only carried out at the bottom of the shallow trench isolations to form the buried layer. By changing the multi-finger structure from C/BE/BE/BE/BE.../C to C/BEBC/BEBC/BEBC/.../C, the entire multi-finger structure contains more collectors that each emitter can be equipped with a collector, so that the current density can be dramatically reduced for every single collector and the buried layer. The distance that the collector current passes is reduced from conventionally passing through the entire multi-finger structure to shorter than the distance of a single cell, as a result, the effective collector resistance can be dramatically decreased, thus improving the cut off frequency characteristics without increasing the total area of the multi-finger structure.

BRIEF DESCRIPTION OF THE DRAWINGS

These and other features of this invention will be more readily understood from the following detailed description of the invention take in conjunction with the accompanying drawings in which.

DETAILED DESCRIPTION OF THE INVENTION

Figure 1:
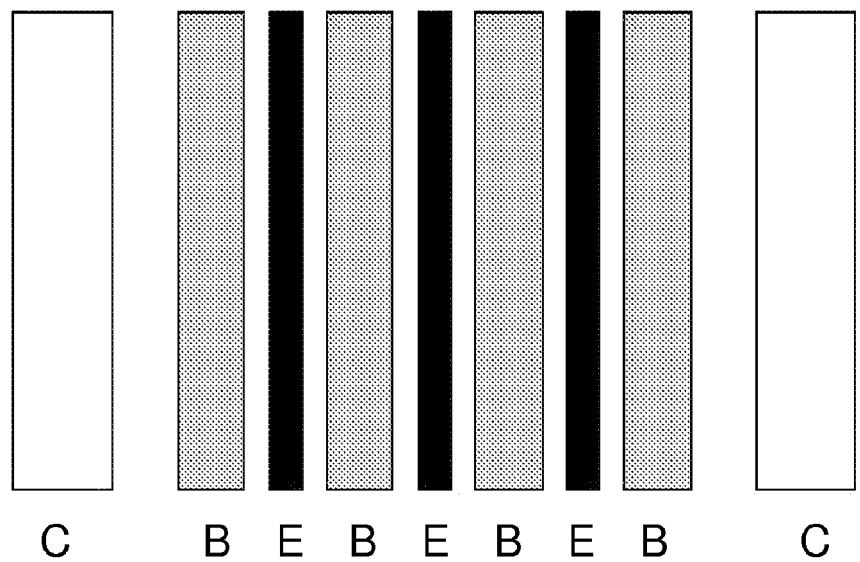
FIG. 1 is a schematic top view of the conventional SiGe HBT multi-finger structure.
Figure 2:
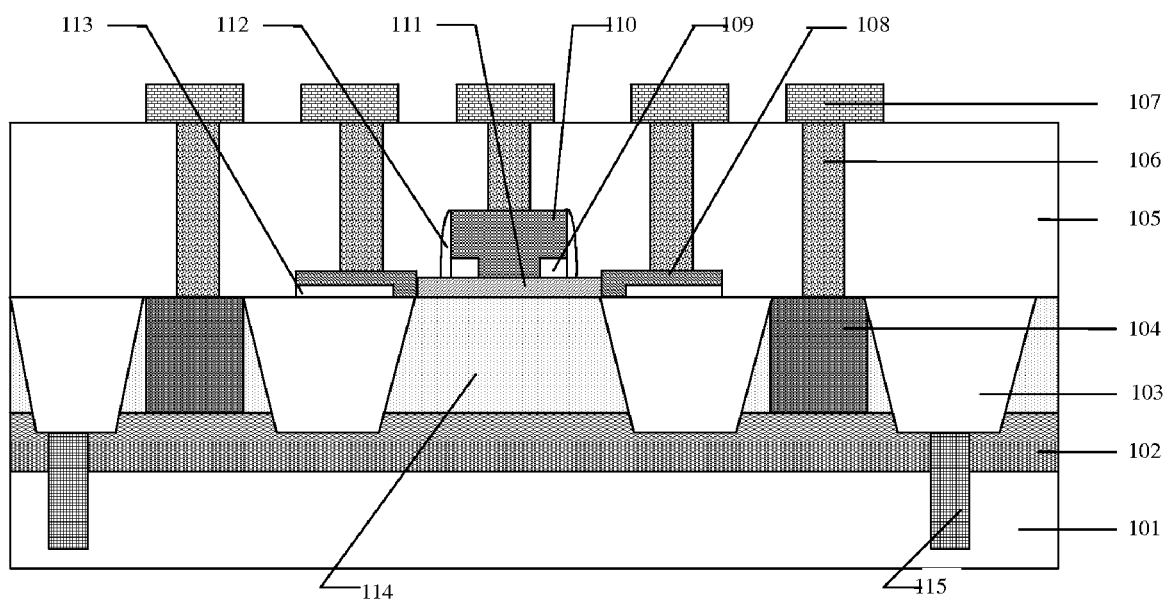
FIG. 2 is a schematic view of a single device of the conventional SiGe HBT multi-finger structure.
Figure 3:
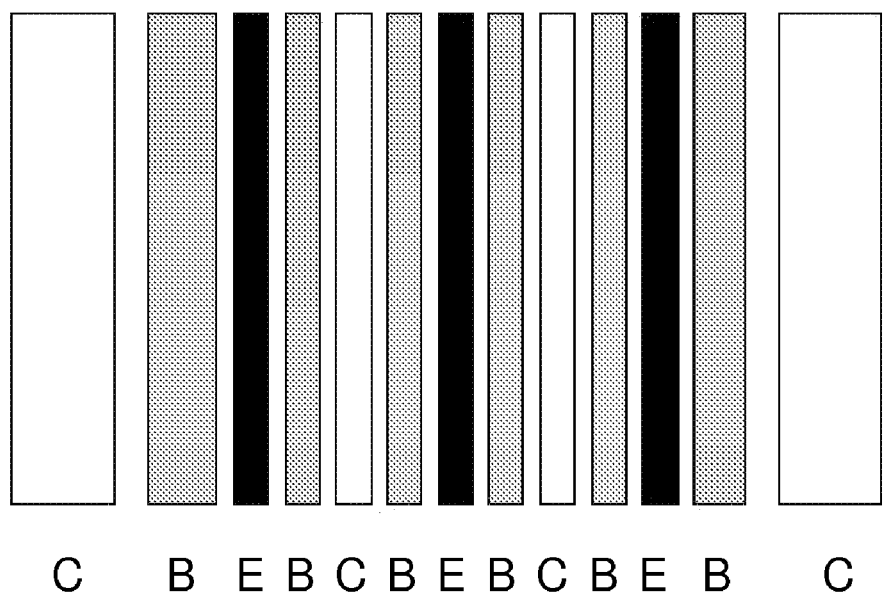
FIG. 3 is a schematic top view of the SiGe HBT multi-finger structure according to a preferred embodiment of the present invention.

As illustrated in FIG. 3, the SiGe HBT multi-finger structure of the present invention consists of multiple SiGe HBT single cells. The structure can be denoted by E (emitter), B (base) and C (collector) as C/BEBC/BEBC/BEBC/.../C, wherein CBEBC represents a single cell of the SiGe HBT, and C is shared by neighboring single cells of the SiGe HBT.

Figure 4:
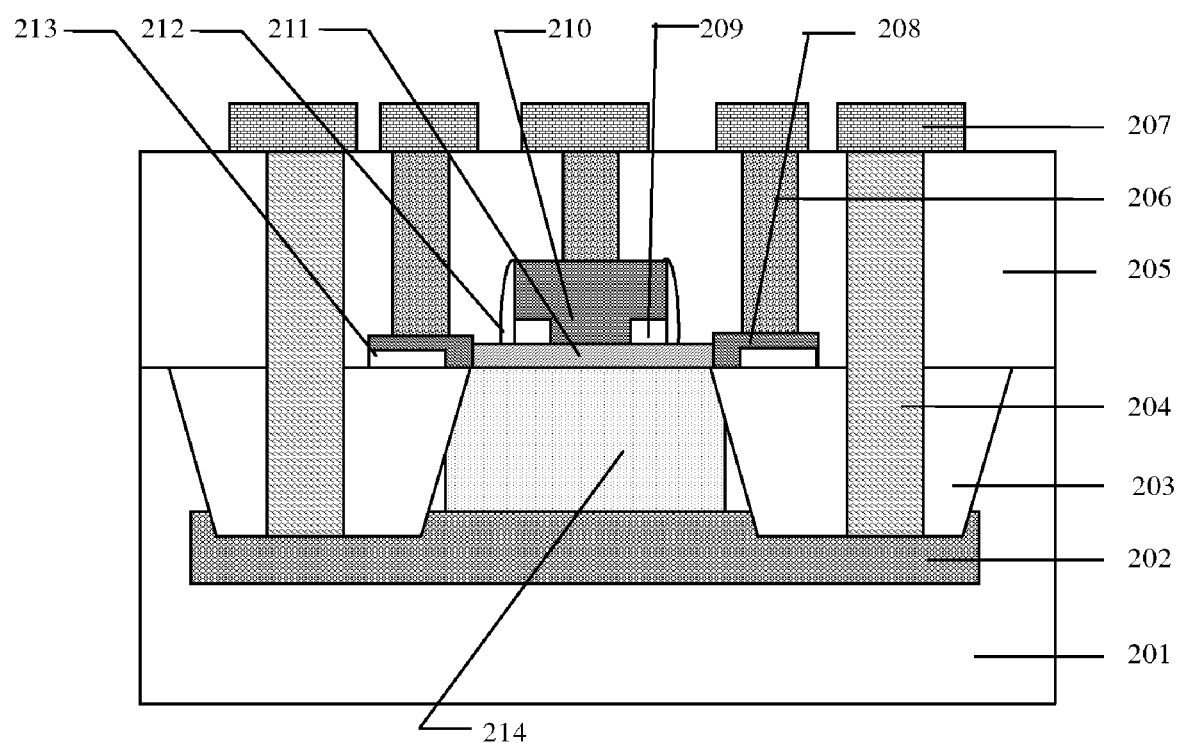
FIG. 4 is a schematic view of a single device of the SiGe HBT multi-finger structure according to a preferred embodiment of the present invention.

FIG. 4 illustrates a single cell of the SiGe HBT multi-finger structure of the present invention. The active regions of the SiGe HBT single cell are isolated by field oxide STI (shallow trench isolation). The single cell includes a collector region 214, a base region 211, and an emitter region 210. The collector region 214 is formed by an n type impurity ion implanted layer in the active region. The bottom of the collector region 214 is connected to a buried layer formed by two n type pseudo buried layers 202 in the substrate 201. The two pseudo buried layers 202 are formed by n type impurity ion implantation to the bottom of the shallow trench at both sides of the active region. Two collectors (collector electrodes) are formed by connecting the collector region 214 to the metal layer 207 through the pseudo buried layers 202 and the deep trench contacts 204 opened through the field oxide STI 203 and the ILD (inter-layer dielectric) 205. The base region 211 is formed by a p type SiGe epitaxial layer on top of the collector region 214. Two bases (base electrodes) are formed by connecting the base region 211 to the metal layer 207 through the two polysilicon layers 208 at both sides of the base region 211 and the metal contacts 206 in the ILD 205. The emitter region 210 is consisted of an n type polysilicon layer formed on top of the base region 211. An emitter (emitter electrode) is formed by directly connecting the emitter region 210 to the metal layer 207 through a metal contact.

The implantation impurity of the two pseudo buried layers 202 is phosphorous with a dosage of 1e14~1e16 $cm^{-2}$ and an energy of 2~50 KeV. When the two pseudo buried layers 202 are under implantation, the top of the active region is protected by a hard mask, and the sidewalls of the active region are protected by spacers, to prevent the ions impurities of the two pseudo buried layers 202 from being implanted into the active region. The hard mask is formed by a first layer (silicon oxide $SiO_2$), a second layer (silicon nitride $Si_3N_4$), and a third layer (silicon oxide $SiO_2$) from the bottom up. The thickness of the hard mask is determined by the energy of the ion implantation to the pseudo buried layers 202. The hard mask should be thick enough so as not to be penetrated by the ions. The thicknesses of the first layer, the second layer, and the third layer are respectively 100 Å~300 Å, 200 Å~500 Å, and 300 Å~800 Å. The thickness of the sidewall spacers is also determined by the energy of the ion implantation. The sidewall spacers should be thick enough so as not to be penetrated by the ions. The thickness of the sidewall spacers is 300 Å~1000 Å. When the width of the active region is small, the two pseudo buried layers can be interconnected in the active region via laterally diffusion to form the buried layer for the collector region 214; when the width of the active region is large, an implantation of the same impurity type as the pseudo buried layers 202 is carried out in the active region at the same depth as the pseudo buried layers 202 to connect the two pseudo buried layers 202 to form the buried layer for the collector region 214.

The n type ion implantation impurity of the collector region 214 is phosphorous with a dosage of 1e12~1e14 cm$^{-2}$. The implantation is carried out to the whole SiGe HBT after the removal of the third layer of the hard mask. The deep trench contacts 204 for the collector region 214 are formed by filling the deep trench with titanium and titanium nitride transition metal and metal tungsten. The ohmic contact of the collector region 214 can be directly formed by the metal deep trench contacts 204 and the pseudo buried layers 202, or a self-aligned n type ion impurity implantation can be carried out after deep trench etch to form better ohmic contact to the collector electrodes. Metal deposition can adopt PVD or CVD; the thicknesses of titanium and titanium nitride are respectively 100 Å~500 Å and 50 Å~500 Å. The depth of the deep trench 204 is determined by the depth of the shallow trench 203 plus the thickness of the inter-layer dielectric 205 between the metal layer 207 and the substrate 201.

When defining the base window, two materials with largely different etch rates are adopted in order to protect the interface between the collector region 214 and the base region 211. The first layer 213 is silicon oxide, the second layer 208 is polysilicon or silicon nitride, the thickness of the first layer 213 is 100 Å~500 Å, the thickness of the second layer 208 is 200 Å~1000 Å. When opening the base window by lithography, the second thin film layer 208 is etched first, and stops on the first thin film layer 213 that is almost intact, then n type impurity ion implantation to collector region 214 is carried out with the photo resist on.

Compared with the existing active region diffusion collector pick up 104, the deep trench contact 204 of the present invention saves huge area. At the same time, as the collector pick up is inside the shallow trench field oxide 203, no large collector capacitance will exist. Therefore, when adopting multi-finger structure to increase the current driving capability, the number of the collectors can be increased, so that in one aspect the distance of the current path is reduced, and in another aspect the collector electrode current density is decreased, thus reducing the device area.

While the invention has been particularly shown and described with reference to the preferred embodiments thereof, it will be understood by those skilled in the art that various changes in form and details may be made without departing from the spirit of the invention or from the scope of the appended claims.

What is claimed is:

1. A SiGe heterojunction bipolar transistor (HBT) multi-finger structure, consisting of a plurality of SiGe HBT single cells; the multi-finger structure being expressed as C/BEBC/BEBC/.../C, wherein C, B and E respectively represents a collector, a base and an emitter of a SiGe HBT, and CBEBC represents a SiGe HBT single cell, two neighboring SiGe HBT single cells sharing a same collector; an active region of a SiGe HBT single cell being isolated by field oxide shallow trenches, wherein a SiGe HBT single cell comprises:

a collector region, consisting of an n type ion impurity implanted layer formed in the active region, the bottom of the collector region being connected to a buried layer formed by two n type pseudo buried layers at both sides of the active region, the collector region being connected to two collectors through the two n type pseudo buried layers and two deep trench contacts formed in the field oxide above the n type pseudo buried layers;

a base region, consisting of a p type SiGe epitaxial layer formed on top of the collector region, the base region being connected to two bases through two polysilicon layers at both sides of the base region and two metal contacts formed on the polysilicon layers; and an emitter region, consisting of an n type polysilicon layer formed on top of the base region, the emitter region being connected to an emitter through a metal contact formed on top of the emitter region.

2. The SiGe HBT multi-finger structure as claimed in claim 1, wherein, the n type ion impurity is phosphorus, and the dosage is 5e12~1e14 cm$^{-2}$.

3. The SiGe HBT multi-finger structure as claimed in claim 1, wherein, the n type pseudo buried layers are formed by n type ion impurity implantation; the n type ion impurity is phosphorus.

4. The SiGe HBT multi-finger structure as claimed in claim 3, wherein, the dosage of the n type ion impurity implantation is 1e14~1e16 cm$^{-2}$, and the energy is 2~50 KeV.

5. The SiGe HBT multi-finger structure as claimed in claim 3, wherein, during the implantation of the pseudo buried layers, the top of the active region is protected by a hard mask, and the sidewalls of the active region are protected by sidewall spacers to prevent ion impurity from implanting into the active region.

6. The SiGe HBT multi-finger structure as claimed in claim 5, wherein, the hard mask is consisted of three dielectric layers, which are from the bottom up a silicon oxide layer, a silicon nitride layer, and a silicon oxide layer.

7. The SiGe HBT multi-finger structure as claimed in claim 6, wherein, the thicknesses of the three dielectric layers from the bottom up are respectively in the ranges of 100 Å~300 Å, 200 Å~500 Å, and 300 Å~800 Å, the thicknesses being determined by the energy of the n type ion impurity implantation.

8. The SiGe HBT multi-finger structure as claimed in claim 5, wherein, the thickness of the sidewall spacers is in a range of 300 Å~1000 Å, being determined by the energy of the n type ion impurity implantation.

9. The SiGe HBT multi-finger structure as claimed in claim 6, wherein, the collector region is formed by n type ion impurity implantation to the entire SiGe HBT region after removing of the top silicon oxide layer of the hard mask.

10. The SiGe HBT multi-finger structure as claimed in claim 1, wherein, the two pseudo buried layers are interconnected inside the active region through lateral diffusion to form the buried layer.

11. The SiGe HBT multi-finger structure as claimed in claim 1, wherein, the two pseudo buried layers are interconnected to form the buried layer by implanting the same type of ion impurity as of the pseudo buried layers into the active region at the same depth as of the pseudo buried layers.

12. The SiGe HBT multi-finger structure as claimed in claim 1, wherein, the deep trench contact of the collector is formed by filling the deep trench with titanium and titanium nitride transitional metal and metal tungsten.

13. The SiGe HBT multi-finger structure as claimed in claim 12, wherein, the thicknesses of the titanium and the titanium nitride are respectively in a ranged of 100 Å~500 Å and 50 Å~500 Å.

14. The SiGe HBT multi-finger structure as claimed in claim 1, wherein, an ohmic contact of the collector is formed directly by the deep trench contact and the pseudo buried layer connected thereto.

15. The SiGe HBT multi-finger structure as claimed in claim 1, wherein, an ohmic contact of the collector is formed by n type impurity self-aligned implantation to the bottom of the deep trench contact after the deep trench is etched.

* * * * *